(12) United States Patent
Fujii

(10) Patent No.: US 10,791,623 B2
(45) Date of Patent: Sep. 29, 2020

(54) ELECTRONIC DEVICE AND ELECTRONIC MODULE

(71) Applicant: SHINKO ELECTRIC INDUSTRIES CO., LTD., Nagano-shi, Nagano (JP)

(72) Inventor: Tomoharu Fujii, Nagano (JP)

(73) Assignee: SHINKO ELECTRONIC INDUSTRIES CO., LTD., Nagano-Shi (JP)

(*) Notice: Subject to any disclaimer, the term of this patent is extended or adjusted under 35 U.S.C. 154(b) by 0 days.

(21) Appl. No.: 16/221,965

(22) Filed: Dec. 17, 2018

(65) Prior Publication Data

US 2019/0191546 A1 Jun. 20, 2019

(30) Foreign Application Priority Data

Dec. 19, 2017 (JP) .................. 2017-242511

(51) Int. Cl.
| | |
|---|---|
| H05K 1/02 | (2006.01) |
| H05K 1/14 | (2006.01) |
| H04B 1/44 | (2006.01) |
| H05K 7/02 | (2006.01) |
| H05K 1/11 | (2006.01) |

(Continued)

(52) U.S. Cl.
CPC ............ *H05K 1/0243* (2013.01); *H04B 1/12* (2013.01); *H04B 1/44* (2013.01); *H04B 1/525* (2013.01); *H05K 1/0218* (2013.01); *H05K 1/115* (2013.01); *H05K 1/144* (2013.01); *H05K 7/026* (2013.01); *H05K 2201/09618* (2013.01); *H05K 2201/09972* (2013.01); *H05K 2201/10098* (2013.01)

(58) Field of Classification Search
CPC ...... H05K 1/0243; H05K 1/115; H05K 1/144; H05K 7/026; H04B 1/44
See application file for complete search history.

(56) References Cited

U.S. PATENT DOCUMENTS 7,129,416 B1 * 10/2006 Steinfeld .............. H05K 1/0219
174/255
7,791,541 B2 * 9/2010 Chang .................. H01Q 1/2283
343/700 MS (Continued)

FOREIGN PATENT DOCUMENTS

JP 2013-229861 11/2013

*Primary Examiner* — Daniel P Wicklund
*Assistant Examiner* — Christopher L Augustin
(74) *Attorney, Agent, or Firm* — Rankin, Hill & Clark LLP

(57) ABSTRACT

An electronic device includes a first wiring substrate having a first corner part, a first ground pattern formed on a lower surface of the first wiring substrate with avoiding the first corner part, a second ground pattern formed on an upper surface of the first wiring substrate with avoiding the first corner part, a second wiring substrate provided above the first wiring substrate and including a second corner part above the first corner part, a third ground pattern formed on a lower surface of the second wiring substrate with avoiding the second corner part, a fourth ground pattern formed on an upper surface of the second wiring substrate with avoiding the second corner part, a plurality of terminals electrically connected to each of the first, second, third and fourth ground patterns, and an antenna fixed to the upper surface of the second wiring substrate at the second corner part.

8 Claims, 18 Drawing Sheets

(51) Int. Cl.
*H04B 1/525* (2015.01)
*H04B 1/12* (2006.01)

(56) References Cited

U.S. PATENT DOCUMENTS

| | | | |
|---|---|---|---|
| 2002/0140081 A1* | 10/2002 | Chou | H05K 1/16 |
| | | | 257/700 |
| 2003/0052827 A1* | 3/2003 | Umehara | H01Q 9/0421 |
| | | | 343/700 MS |
| 2004/0240191 A1* | 12/2004 | Arnold | H05K 9/003 |
| | | | 361/800 |
| 2005/0176380 A1* | 8/2005 | Okabe | H04B 1/38 |
| | | | 455/73 |
| 2011/0051375 A1* | 3/2011 | Ammar | H01L 25/16 |
| | | | 361/728 |
| 2013/0271925 A1 | 10/2013 | Ikuta | |
| 2016/0233571 A1* | 8/2016 | Lo Hine Tong | H01Q 1/2283 |
| 2016/0302304 A1 | 10/2016 | Ikuta | |
| 2017/0273173 A1 | 9/2017 | Ikuta | |
| 2018/0248254 A1* | 8/2018 | Islam | H05K 1/0243 |

\* cited by examiner

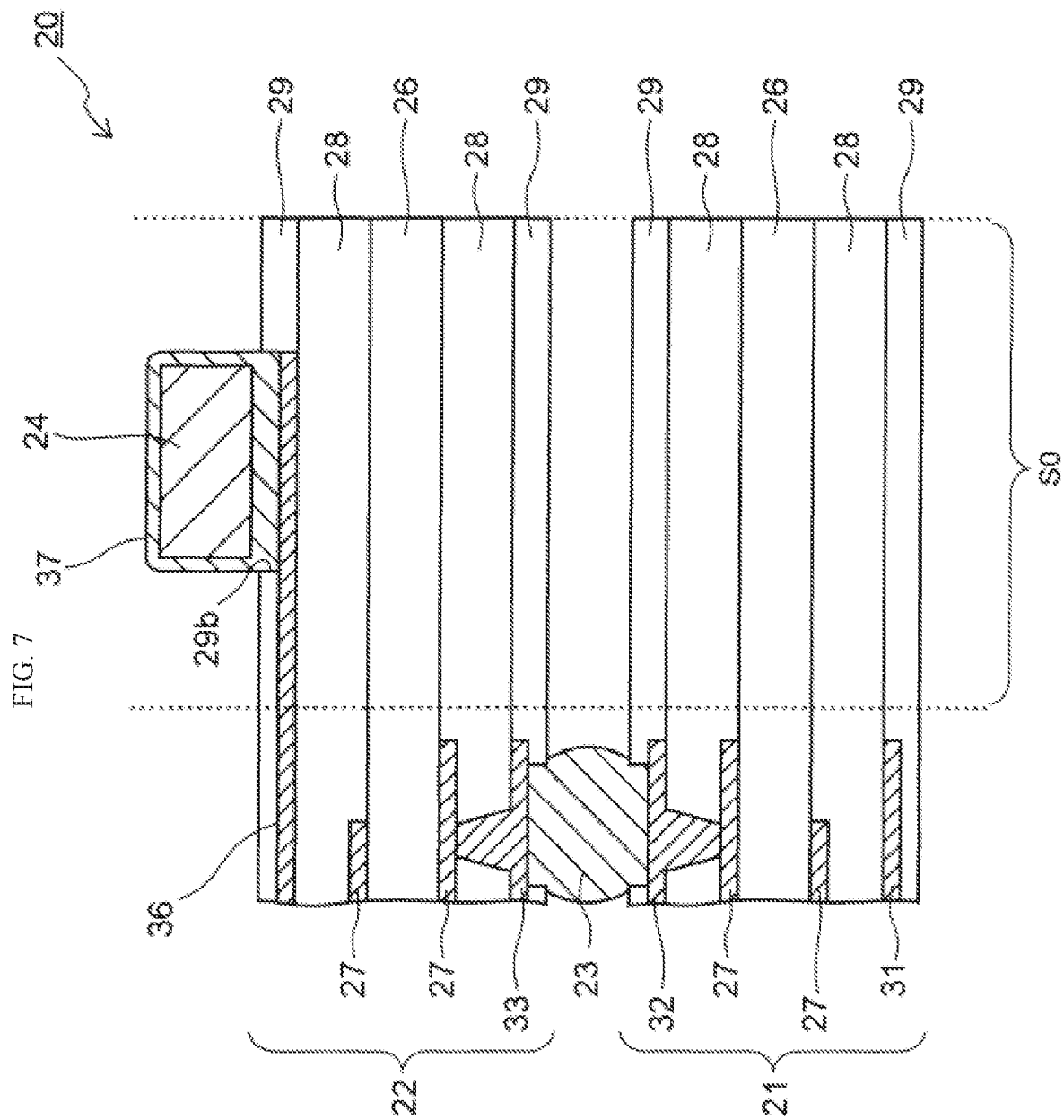

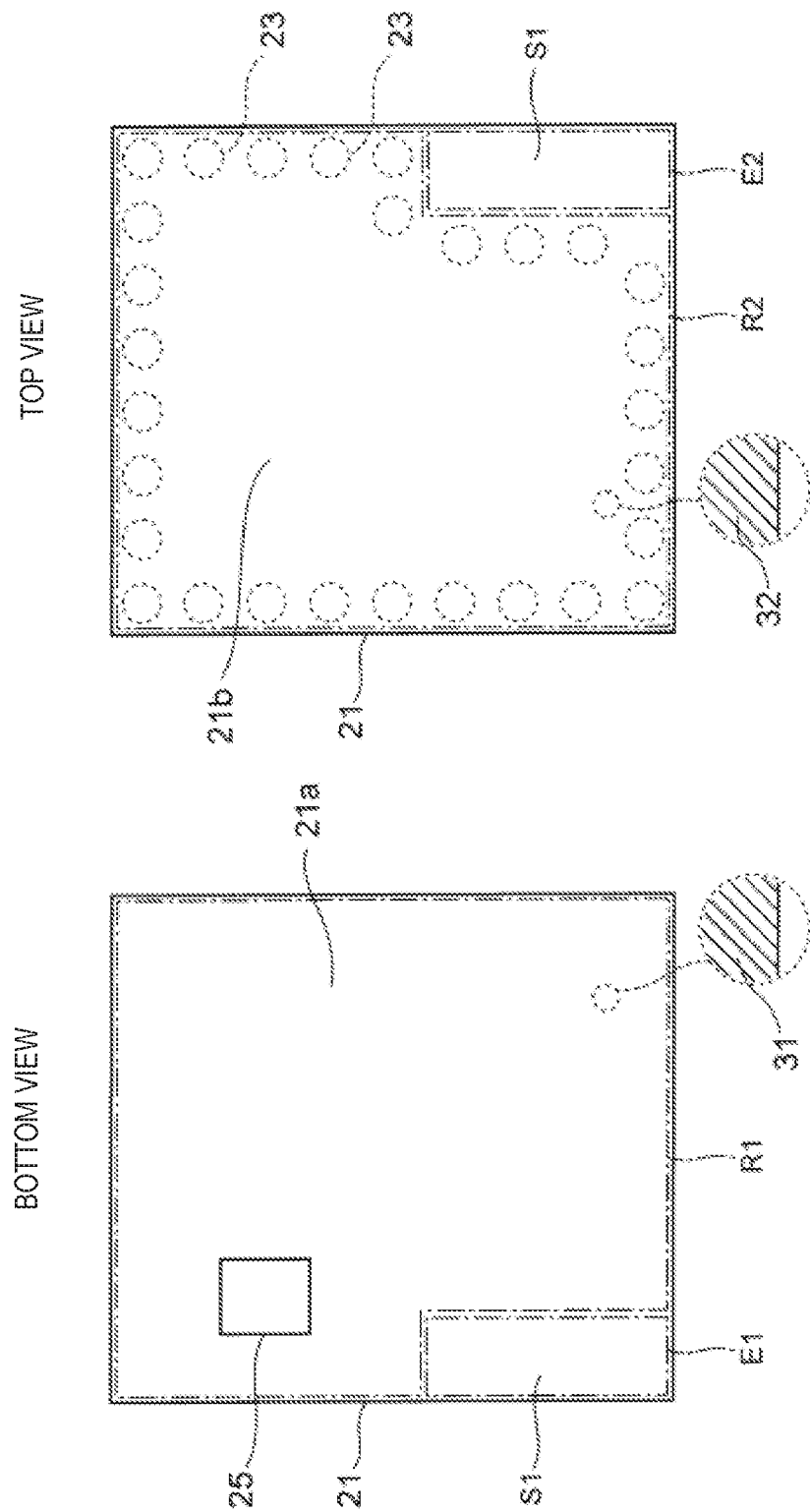

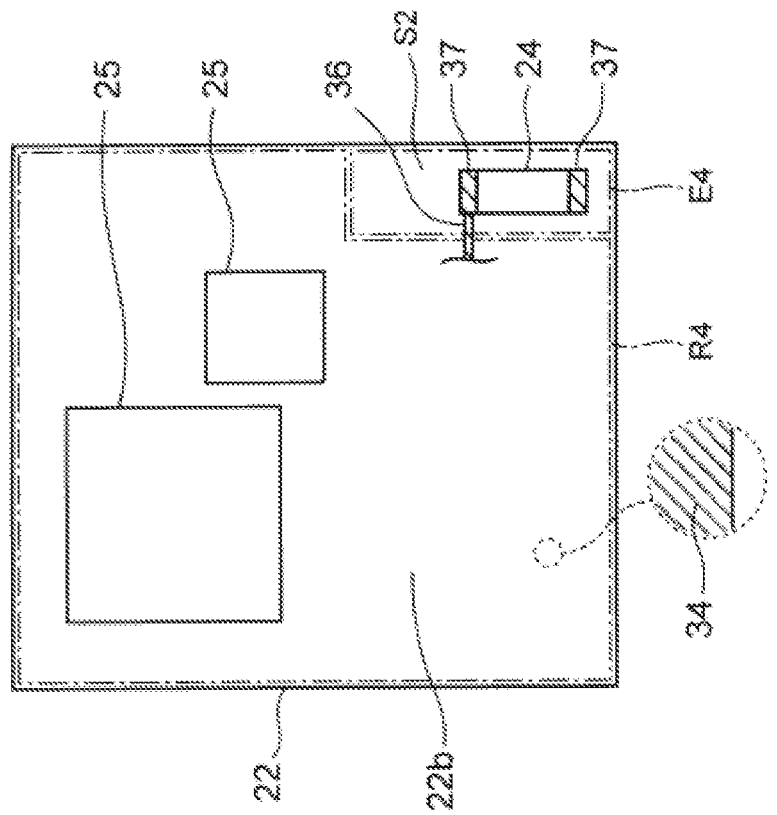
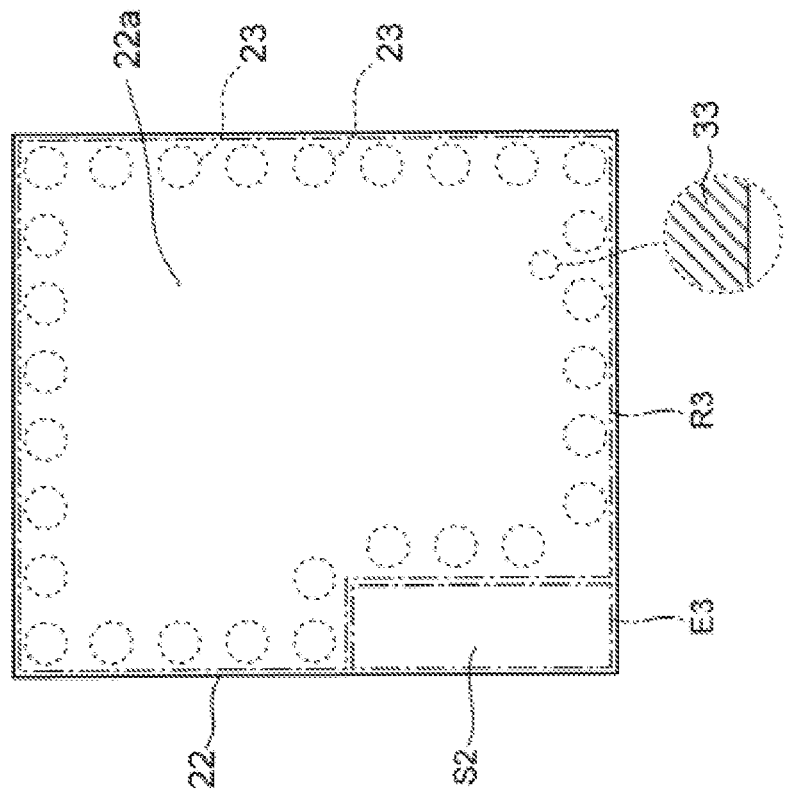
FIG. 9A BOTTOM VIEW
FIG. 9B TOP VIEW

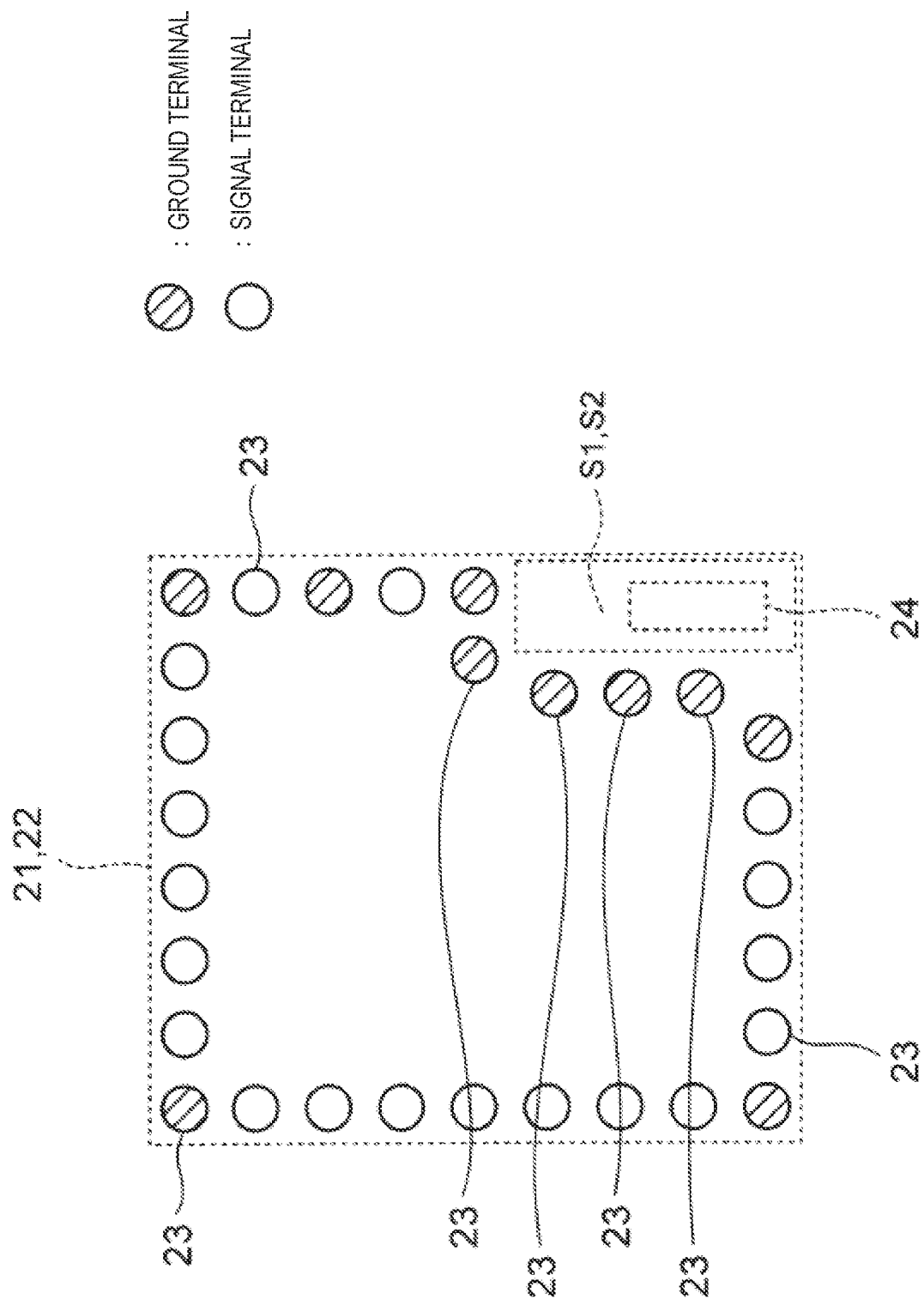

FIG. 13

|  | 1 WAVELENGTH | 1/2 WAVELENGTH | 1/4 WAVELENGTH | 1/16 WAVELENGTH |
|---|---|---|---|---|
| WAVELENGTH IN SPACE S | 125mm | 62.5mm | 31.3mm | 15.6mm |
| WAVELENGTH IN EACH OF WIRING SUBSTRATES 21, 22 | 62.5mm | 31.3mm | 15.6mm | 7.8mm |

TOP VIEW OF FIRST WIRING SUBSTRATE 21

TOP VIEW OF SECOND WIRING SUBSTRATE 22

ELECTRONIC DEVICE AND ELECTRONIC MODULE

CROSS-REFERENCE TO RELATED APPLICATION

This application is based on and claims priority under 35 USC 119 from Japanese Patent Application No. 2017-242511 filed on Dec. 19, 2017.

TECHNICAL FIELD

The present disclosure relates to an electronic device and an electronic module.

BACKGROUND ART

As an age of IoT (Internet of Things) has come, a variety of small electronic devices capable of connecting to a network through wireless communication have been developed. In the electronic device, since a small chip antenna for performing wireless communication is mounted on a wiring substrate, downsizing of the electronic device is hindered due to a size of the chip antenna.

Patent Document 1: JP-A-2013-229861

SUMMARY OF INVENTION

Exemplary embodiments of the present invention provide an electronic device and an electronic module capable of being downsized.

An electronic device according to an exemplary embodiment, comprises:

a first wiring substrate having a first corner part;

a first ground pattern formed on a lower surface of the first wiring substrate with avoiding the first corner part;

a second ground pattern formed on an upper surface of the first wiring substrate with avoiding the first corner part;

a second wiring substrate provided above the first wiring substrate with facing the first wiring substrate and comprising a second corner part above the first corner part;

a third ground pattern formed on a lower surface of the second wiring substrate with avoiding the second corner part;

a fourth ground pattern formed on an upper surface of the second wiring substrate with avoiding the second corner part;

a plurality of terminals provided between the first wiring substrate and the second wiring substrate and electrically connected to each of the first ground pattern, the second ground pattern, the third ground pattern and the fourth ground pattern; and an antenna fixed to the upper surface of the second wiring substrate at the second corner part.

According to one aspect, since the first to fourth ground patterns are respectively formed with avoiding the first corner part and the second corner part, it is possible to suppress a radio wave, which is to be transmitted and received by the antenna fixed to the second corner part, from being shielded by the first to fourth ground patterns. Thereby, it is not necessary to make the chip antenna protrude laterally from the second wiring substrate so as to prevent the radio wave from being shielded by the first to fourth ground patterns, so that it is possible to downsize the electronic device.

Further, each of the first to fourth ground patterns is electrically connected by the terminals, so that a structure, which is equivalent to a structure where a thick ground layer is formed next to the antenna, is obtained. Thereby, a large ground region appears next to the antenna, so that it is possible to improve an antenna characteristic such as a reflection characteristic.

BRIEF DESCRIPTION OF DRAWINGS

FIG. 7 is a sectional view taken along a line II-II of FIG. 5.

FIG. 8A is a bottom view of a first wiring substrate of the first exemplary embodiment.

FIG. 8B is a top view of the first wiring substrate of the first exemplary embodiment.

FIG. 9A is a bottom view of a second wiring substrate of the first exemplary embodiment.

FIG. 9B is a top view of the second wiring substrate of the first exemplary embodiment.

FIG. 10 is a plan view depicting arrangement of solder bumps in the first exemplary embodiment.

FIG. 13 shows wavelengths of the radio wave in a space and wavelengths of the radio wave in the first and second wiring substrates, which are calculated in the first exemplary embodiment.

DESCRIPTION OF EMBODIMENTS

Before describing exemplary embodiments, the matters that have been examined by the inventors are described.

Figure 1:
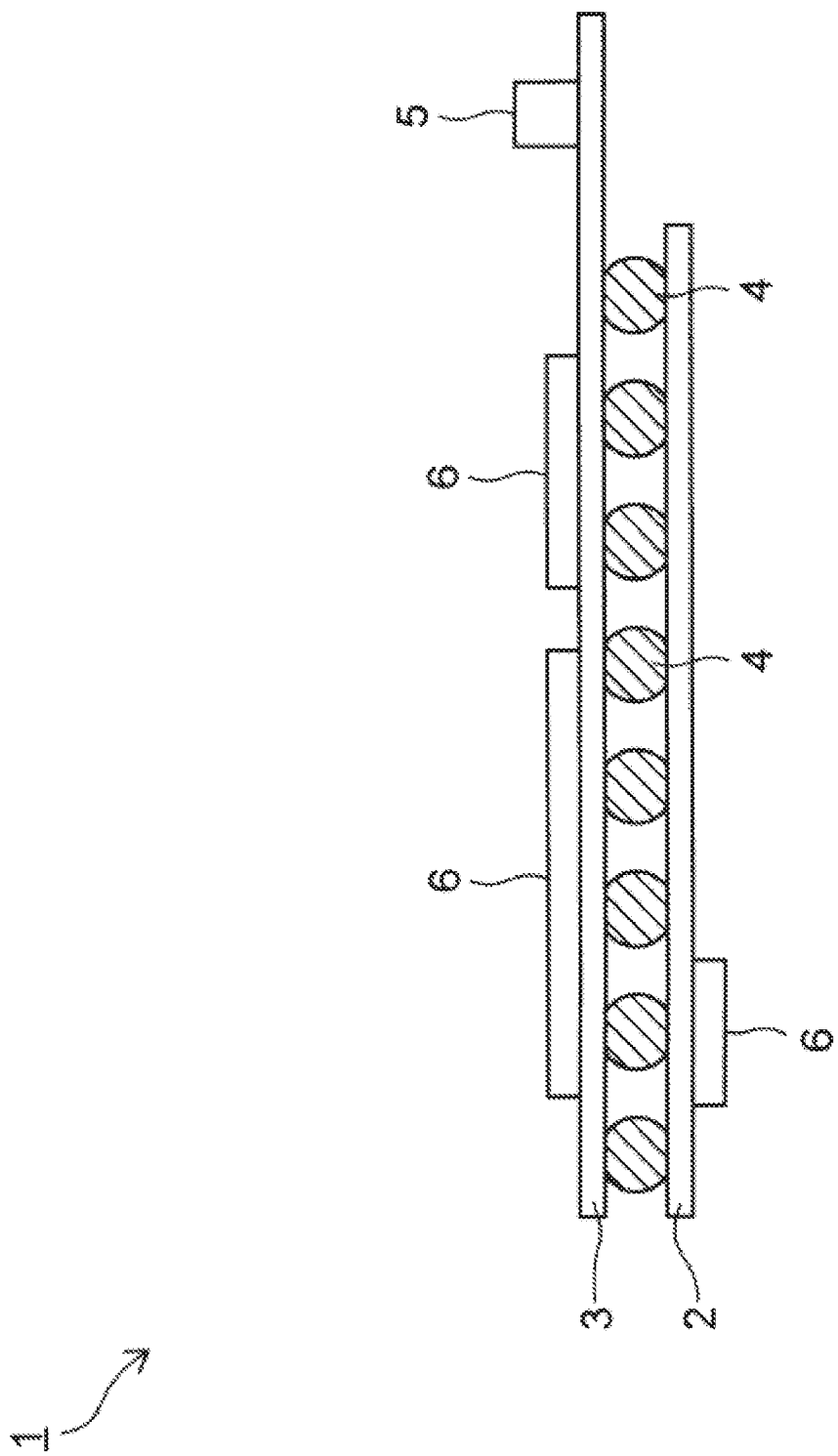
FIG. 1 is a side view of an electronic device used for examination.

FIG. 1 is a side view of an electronic device used for examination.

The electronic device 1 is a POP (Package on Package) that is to be used for wireless communication, and includes a first wiring substrate 2, a second wiring substrate 3, and solder bumps 4 for connecting the wiring substrates.

A surface of each of the wiring substrates 2, 3 is mounted thereon with a chip antenna 5 for wireless communication or an electronic component 6. In order to prevent a radio wave from being shielded by each of the wiring substrates 2, 3, the chip antenna 5 is provided on an upper surface of the second wiring substrate 3. The electronic component 6 is a discrete component such as a chip capacitor, a resistance element and the like.

The respective wiring substrates 2, 3 having the electronic components 6 mounted thereon are vertically stacked, so that it is possible to reduce a planar size of the electronic device 1, as compared to a configuration where the wiring substrates 2, 3 are laterally aligned. As a result, it is possible to downsize the electronic device 1.

Figure 2:
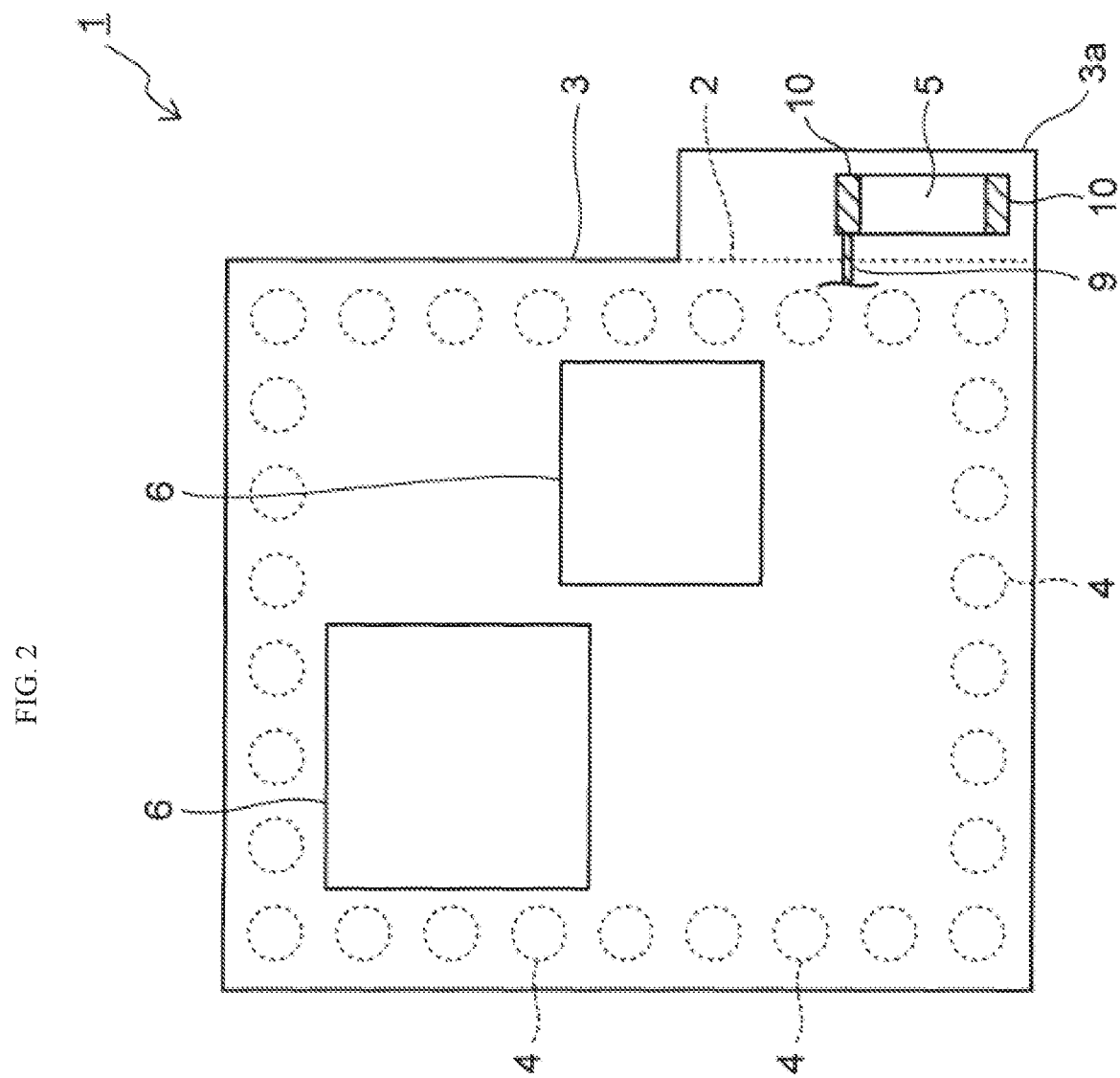
FIG. 2 is a top view of the electronic device used for examination.

FIG. 2 is a top view of the electronic device 1.

As shown in FIG. 2, the second wiring substrate 3 is provided with a protrusion 3a protruding laterally from the substrate. The chip antenna 5 is fixed to the protrusion 3a by a solder 10, and is configured to transmit and receive a signal to and from the second wiring substrate 3 via a conductor pattern 9.

Subsequently, a conductor formation region of each of the wiring substrates 2, 3 is described.

Figure 3:
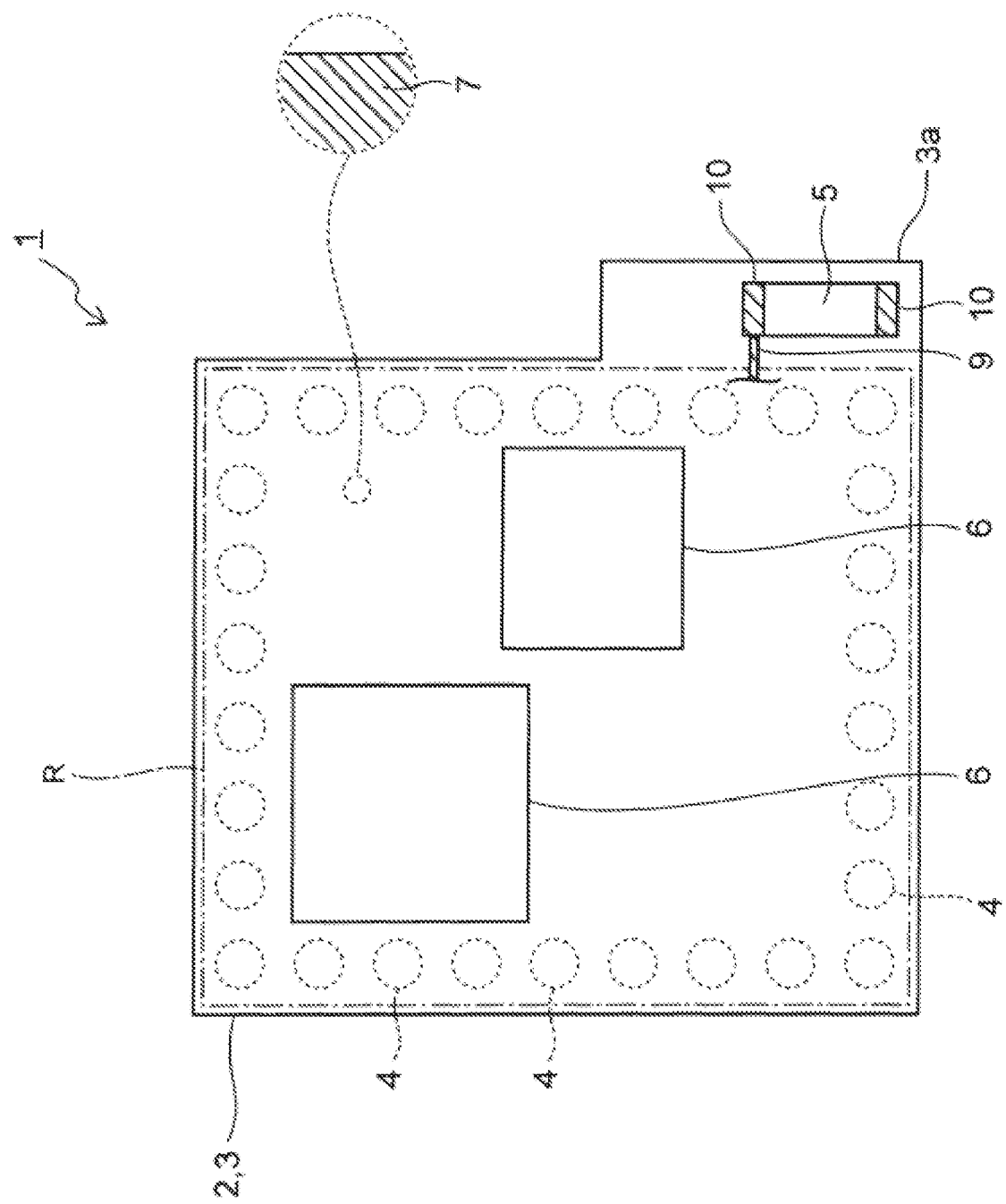
FIG. 3 is a top view for illustrating a conductor formation region of a wiring substrate provided to the electronic device used for examination.

FIG. 3 is a top view for illustrating a conductor formation region of each of the wiring substrates 2, 3.

As shown in FIG. 3, in each of the wiring substrates 2, 3, a rectangular conductor formation region R is demarcated. The conductor formation region R is a region in which a conductor such as a ground pattern 7, a signal line and the like is to be formed, and the conductor and the electronic component 6 are not provided outside the conductor formation region. In the meantime, the ground pattern 7 is formed on both surfaces of each of the wiring substrates 2, 3. Thereby, it is possible to shield the signal line in each of the wiring substrates 2, 3 from being exposed to an outside electromagnetic field by the ground pattern 7.

In the meantime, in the shown example, in order to prevent the radio wave, which is to be transmitted and received by the chip antenna 5, from being shielded by the ground pattern 7 and the electronic component 6, the protrusion 3a is provided outside the conductor formation region R, and only the conductor pattern 9 for transmitting and receiving a signal to and from the chip antenna 5 is provided to the protrusion 3a.

According to the electronic device 1 as described above, since the protrusion 3a of the second wiring substrate 3 is mounted thereon with the chip antenna 5, it is possible to suppress the radio wave, which is to be transmitted and received by the chip antenna 5, from being shielded by the ground pattern 7 and the electronic component 6, so that it is possible to favorably receive the radio wave by the chip antenna 5.

However, the protrusion 3a is provided, so that it is not possible to sufficiently reduce a planar size of the electronic device 1. Therefore, it is not possible to sufficiently use the merit of the POP, i.e., the downsizing of the electronic device 1.

In the below, each exemplary embodiment in which the electronic device can be downsized is described.

First Exemplary Embodiment

Figure 4:
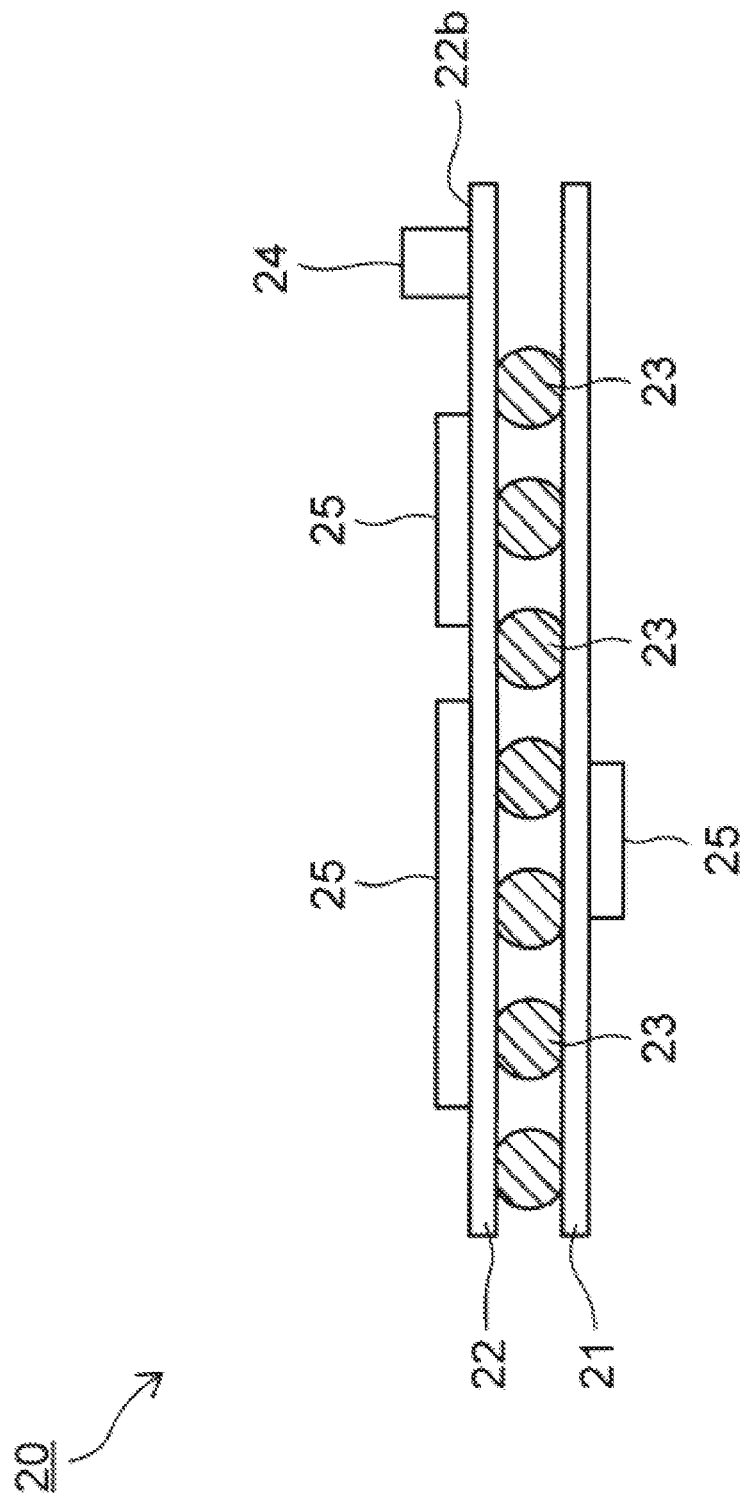
FIG. 4 is a side view of an electronic device in accordance with a first exemplary embodiment.

FIG. 4 is a side view of an electronic device in accordance with a first exemplary embodiment.

The electronic device 20 is a POP that is to be used for wireless communication such as Bluetooth (registered trademark), and includes a first wiring substrate 21 and a second wiring substrate 22 facing each other. A plurality of solder bumps as terminals 23 is provided between the wiring substrates 21, 22, and the wiring substrates 21, 22 are electrically and mechanically connected to each other by the terminals 23.

Also, a chip antenna 24 that is to be used for wireless communication is fixed on an upper surface 22b of the second wiring substrate 22. Although a frequency band of radio waves that are to be transmitted and received by the chip antenna 24 is not particularly limited, it is assumed that radio waves of a high frequency band of 2.4 GHz or higher, on which near field communication such as Bluetooth (registered trademark) is based, are to be transmitted and received by the chip antenna 24.

A plurality of electronic components 25 configured to form a wireless communication circuit together with the chip antenna 24 is mounted on each of the wiring substrates 21, 22. The electronic components 25 include discrete components such as a chip capacitor, a resistance element and the like, for example. Also, an IC (Integrated Circuit) such as a processor is an example of the electronic component 25.

Figure 5:
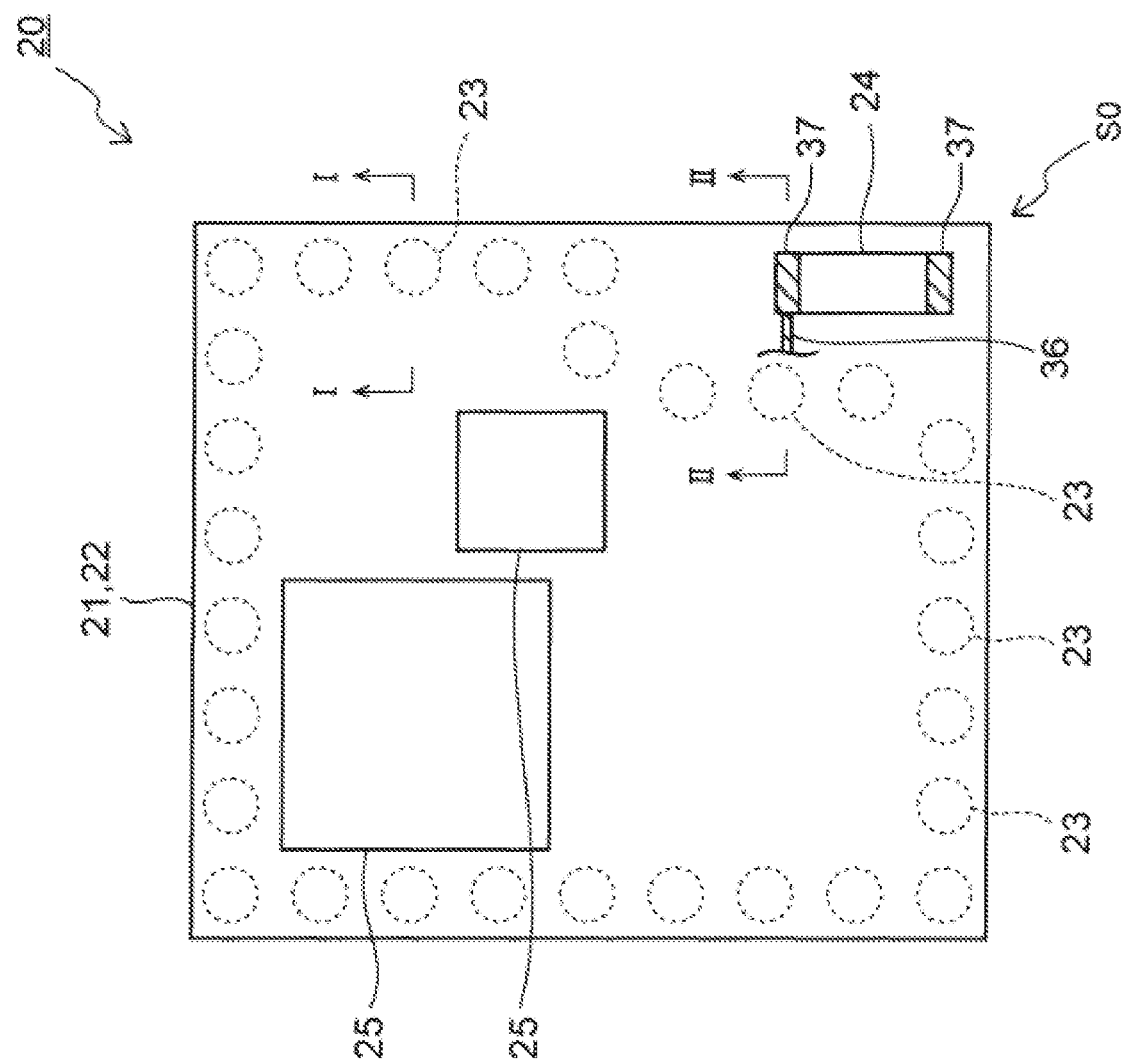
FIG. 5 is a top view of the electronic device in accordance with the first exemplary embodiment.

FIG. 5 is a top view of the electronic device 20.

As shown in FIG. 5, the first wiring substrate 21 and the second wiring substrate 22 have the same planar shape, i.e., a rectangular shape of which a length of one side is about 10 mm to 30 mm, as seen from above.

The chip antenna 24 is fixed to a corner of the second wiring substrate 22. The chip antenna 24 has a rectangular shape of which a length of one side is about 1 mm to 20 mm, as seen from above, and each side thereof is parallel with each side of the second wiring substrate 22.

In the meantime, conductor patterns 36, 37 are connected to the chip antenna 24. The conductor pattern 36 is a signal line for transmitting and receiving a signal between the second wiring substrate 22 and the chip antenna 24, and is formed by patterning a copper-plated film, for example. In the meantime, the conductor pattern 37 is a solder for fixing the chip antenna 24 to the upper surface 22b of the second wiring substrate 22.

Figure 6:
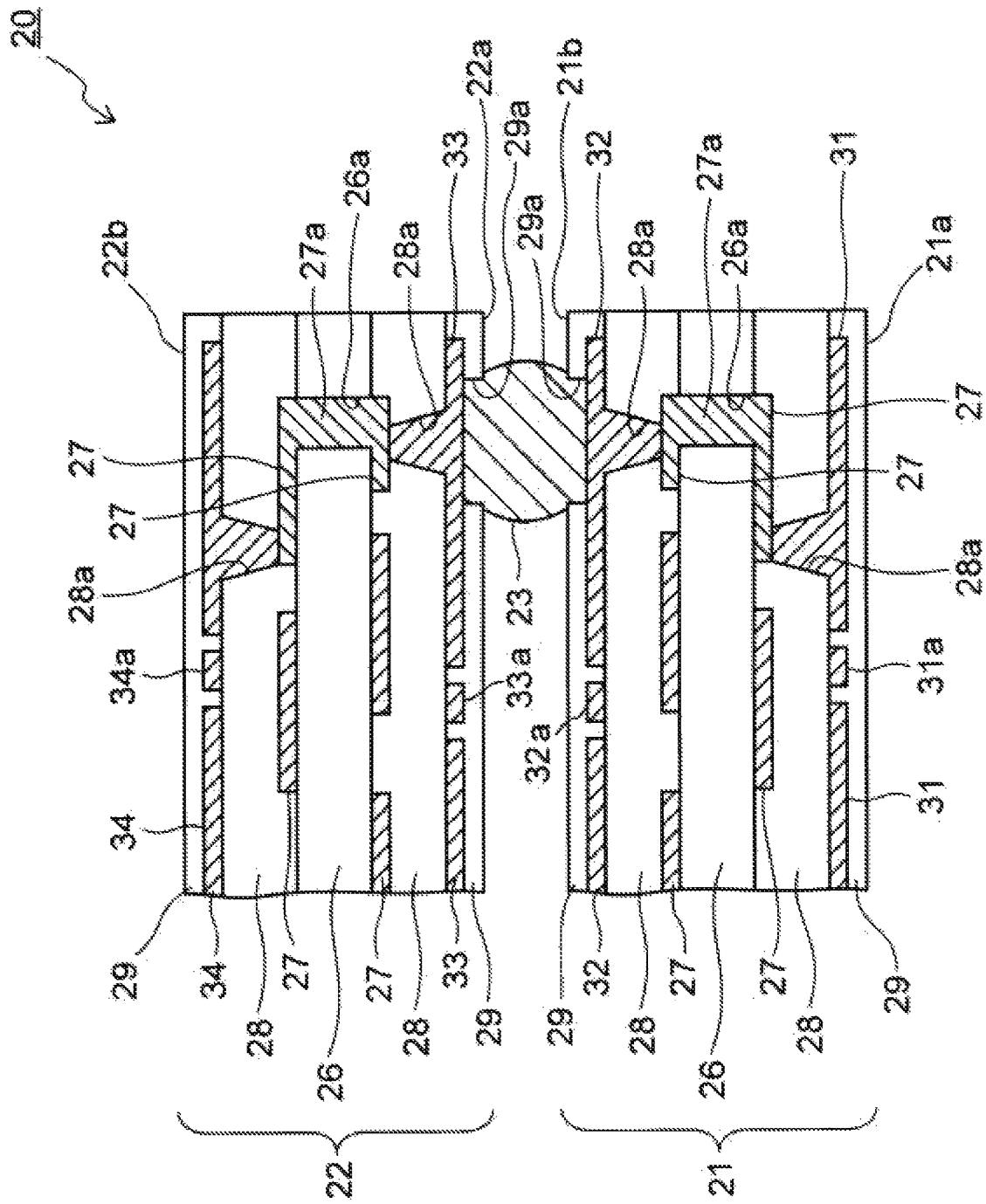
FIG. 6 is a sectional view taken along a line I-I of FIG. 5.

FIG. 6 is a sectional view taken along a line I-I of FIG. 5.

As shown in FIG. 6, the first wiring substrate 21 and the second wiring substrate 22 are a multi-layered wiring substrate having the same structure, respectively.

The first wiring substrate 21 has a lower surface 21a and an upper surface 21b opposite to each other, and is configured by stacking wirings 27 and insulation layers 28 on both surfaces of a core base material 26.

In this example, as the core base material 26, a glass epoxy substrate in which epoxy resin is impregnated in glass cloth is used. A copper-plated film is formed in a through-hole 26a and an opening end thereof of the core base material 26, so that the wiring 27 and a through-electrode 27a is formed.

Also, the insulation layer 28 is a resin layer such as a phenol resin, a polyimide resin, an epoxy resin and the like and is formed therein with a via hole 28a reaching the wiring 27 by laser processing. On the lower surface 21a-side, a first ground pattern 31 and a first signal line 31a obtained by patterning a copper-plated film having a thickness of about 10 μm to 35 μm in the via 28a and on the insulation layer 28 are formed.

Also, on the upper surface 21b-side, a second ground pattern 32 and a second signal line 32a obtained by patterning a copper-plated film having a thickness of about 10 μm to 35 μm in the via 28a and on the insulation layer 28 are formed.

Solder resist layers 29 are respectively formed on each of the ground patterns 31, 32 and on each of the signal lines 31a, 32a, and surfaces of the solder resist layers 29 become the lower surface 21a and the upper surface 21b. The solder resist layer 29 on the upper surface 21b-side is formed with a via 29a having a depth reaching the second ground pattern 32, and the terminal 23 is joined to the second ground pattern 32 in the via 29a.

In the meantime, the second wiring substrate 22 is also a multi-layered wiring substrate having a lower surface 22a and an upper surface 22b opposite to each other, and has a third ground pattern 33 and a third signal line 33a on the lower surface 22a-side and a fourth ground pattern 34 and a fourth signal line 34a on the upper surface 22b-side. Each of the signal lines 33a, 34a and each of the ground patterns 33, 34 are formed by patterning a copper-plated film having a thickness of about 10 μm to 35 μm.

Also, the third ground pattern 33 of the ground patterns is joined to the terminal 23 in the via 29a of the solder resist layer 29.

The terminal 23 is electrically connected to each of the ground patterns 31 to 34, and is kept at a ground potential, together with the ground patterns.

FIG. 7 is a sectional view taken along a line II-II of FIG. 5, and is a sectional view of a corner part S0 of the electronic device 20.

As shown in FIG. 7, the conductor pattern 36 is formed on the insulation layer 28, which is the uppermost layer of the second wiring substrate 22, and a part of the conductor pattern 36 is exposed from a via 29b of the solder resist layer 29. A solder as the conductor pattern 37 is provided in the via 29b, and the chip antenna 24 and the conductor pattern 36 are electrically connected to each other via the conductor pattern 37.

At the corner part S0, a conductor except the conductor patterns 36, 37 does not exist on each of the wiring substrates 21, 22.

Subsequently, each conductor formation region of the first wiring substrate 21 and the second wiring substrate 22 is described.

FIG. 8A is a bottom view of the first wiring substrate 21.

In the example of FIG. 8A, a first conductor formation region R1 is demarcated on the lower surface 21a with avoiding a first corner part S1 of four corners of the first wiring substrate 21. The first conductor formation region R1 is a region in which the first ground pattern 31 and the first signal line 31a are formed. In this case, at the first corner part S1, a first dielectric region E1 in which a conductor such as the first ground pattern 31 and the first signal line 31a does not exist is demarcated.

The first dielectric region E1 is a rectangular region, as seen from above, and a length of a short side thereof is about 3 mm to 5 mm and a length of a long side is about 5 mm to 10 mm, for example. This also applies to second to fourth dielectric regions E2 to E4, which will be described later.

FIG. 8B is a top view of the first wiring substrate 21.

As shown in FIG. 8B, a second conductor formation region R2 in which the second ground pattern 32 and the second signal line 32a are formed is demarcated on the upper surface 21b of the first wiring substrate 21. Like the first conductor formation region R1, the second conductor formation region R2 is also set with avoiding the first corner part S1, and at the first corner part S1, a second dielectric region E2 in which a conductor such as the second ground pattern 32 and the second signal line 32a does not exist is demarcated.

Also, in this example, the conductor such as the electronic component 25 and the wiring 27 (refer to FIG. 6) is also not formed at the first corner part S1, so that the conductor does not exist at the first corner part S1 when the first wiring substrate 21 is projected from above.

FIG. 9A is a bottom view of the second wiring substrate 22.

As shown in FIG. 9A, the second wiring substrate 22 has a second corner part S2. The second corner part S2 is a corner part, which is positioned above the first corner part S1 (refer to FIG. 8A) of the first wiring substrate 21, of four corners of the second wiring substrate 22.

A third conductor formation region R3 in which the third ground pattern 33 and the third signal line 33a are formed is demarcated on the lower surface 22a of the second wiring substrate 22 with avoiding the second corner part S2. Thereby, a third dielectric region E3 in which a conductor such as the third ground pattern 33 and the third signal line 33a does not exist is demarcated in the second corner part S2.

FIG. 9B is a top view of the second wiring substrate 22.

As shown in FIG. 9B, the chip antenna 24 is provided on the upper surface 22b of the second wiring substrate 22 at the second corner part S2. The chip antenna 24 is fixed to the second corner part S2 by the conductor pattern 37 such as a solder, as described above, and is configured to transmit and receive a signal to and from the second wiring substrate 22 via the conductor pattern 36 such as a copper pattern.

Also, a fourth conductor formation region R4 in which the fourth ground pattern 34 and the fourth signal line 34a are formed is demarcated on the upper surface 22b of the second wiring substrate 22 with avoiding the second corner part S2. Thereby, a fourth dielectric region E4 in which a conductor such as the fourth ground pattern 34 and the fourth signal line 34a does not exist is demarcated in the second corner part S2.

Also, the conductor such as the electronic component 25 and the wiring 27 (refer to FIG. 6) is not also formed in the second corner part S2, so that a conductor except the conductor patterns 36, 37 does not exist in the second corner part S2 when the second wiring substrate 22 is projected from above.

FIG. 10 is a plan view depicting arrangement of the terminals 23.

As shown in FIG. 10, the terminals 23 are provided with intervals along edges of the respective wiring substrates 21, 22 with avoiding the respective corner parts S1, S2.

Some of the terminals 23 function as terminals electrically connected to each of the ground patterns 31 to 34, and the other terminals function as signal terminals.

In this example, the ground terminals are provided along the edges of the respective corner parts S1, S2, so that a clear ground region appears next to the chip antenna 24.

Also, sizes and intervals of the respective terminals 23 are not limited. For example, solder bumps having a diameter of about 0.3 mm to 1.2 mm may be aligned with intervals of about 0.5 mm to 1.5 mm.

According to the electronic device 20 as described above, since each of the ground patterns 31 to 34 is formed with avoiding the respective corner parts S1, S2, it is possible to suppress the radio wave, which is to be transmitted and received by the chip antenna 24, from being shielded by each of the ground patterns 31 to 34. Thereby, it is not necessary to make the chip antenna 24 protrude laterally from the second wiring substrate 22 so as to prevent the radio wave from being shielded each of the ground patterns 31 to 34, so that it is possible to downsize the electronic device 20.

Further, each of the ground patterns 31 to 34 next to the chip antenna 24 is electrically connected by the terminals 23, so that a structure, which is equivalent to a structure where a thick ground layer is formed next to the chip antenna 24, is obtained. Thereby, a large ground region appears next to the chip antenna 24, so that it is possible to improve an antenna characteristic of the chip antenna 24 such as a reflection characteristic.

In particular, as shown in FIG. 10, the ground terminals are provided along the edges of the respective corner parts S1, S2, so that a ground region clearly appears next to the chip antenna 24 and it is possible to further improve the antenna characteristic of the chip antenna 24.

Furthermore, since a conductor except the conductor patterns 36, 37 does not exist when the respective corner parts S1, S2 are projected from above, it is possible to suppress the radio wave, which is to be transmitted and received by the chip antenna 24, from being shielded by the corner parts S1, S2.

The inventors actually measured the reflection characteristic of the chip antenna 24 of the electronic device 20. The measurement result is shown in FIG. 11.

Figure 11:
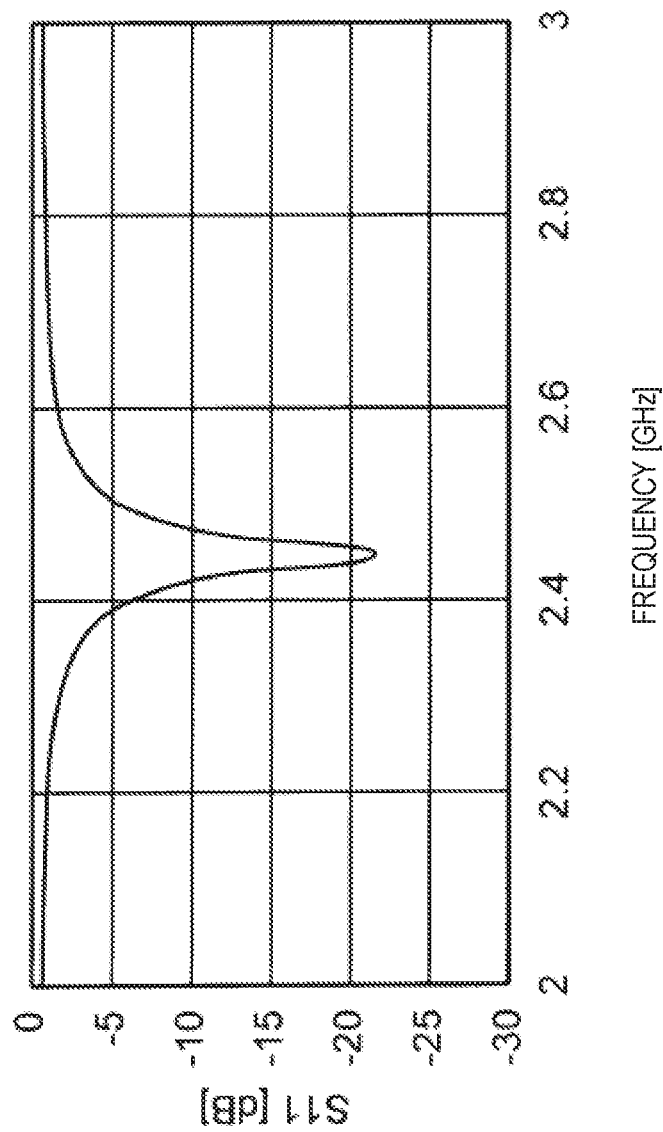
FIG. 11 is a view showing a measurement result of a reflection characteristic of a chip antenna of the electronic device in accordance with the first exemplary embodiment.

In FIG. 11, the horizontal axis indicates a frequency of the radio wave received by the chip antenna 24, and the vertical axis indicates an S11 component of an S parameter. In the meantime, the S11 component is an index indicative of the reflection characteristic of the chip antenna 24. Also, in this examination, it is assumed that the frequency of the radio wave transmitted and received by the chip antenna 24 is within 2.4 GHz band prescribed in Bluetooth (registered trademark).

As shown in FIG. 11, a return loss of the chip antenna 24 is reduced at the frequencies in the vicinity of 2.4 GHz, so that the radio wave in 2.4 GHz band can be received. From the result, it can be seen that the configuration where the conductor is excluded from each of the corner parts S1, S2 and the ground patterns 31 to 34 are respectively electrically connected by the terminals 23, like the first exemplary embodiment, is efficient to improve the reflection characteristic of the chip antenna 24.

In the meantime, in order to favorably transmit and receive the radio wave by the chip antenna 24, it is preferably to exclude a three-dimensional structure of a conductor from the periphery of the chip antenna 24 and to suppress turbulence of the radio wave due to the conductor. Therefore, the inventor evaluated a degree of thickness of each of the ground patterns 31 to 34 seen from the radio wave in 2.4 GHz band, which is to be transmitted and received by the chip antenna 24.

Figure 12:
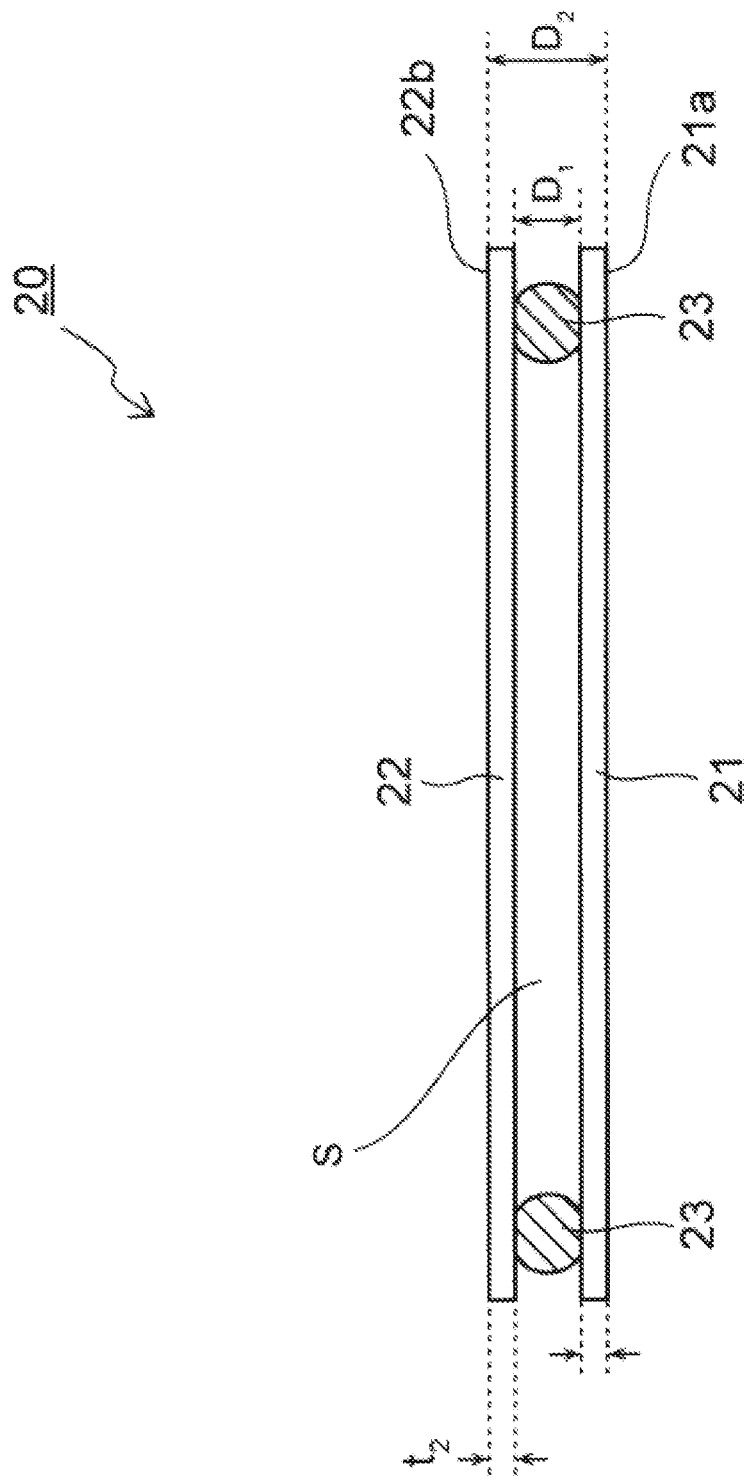
FIG. 12 is a pictorial sectional view of the electronic device used for evaluating a degree of thickness of each of first to fourth ground patterns seen from a radio wave, which is to be transmitted and received by the chip antenna, in the first exemplary embodiment.

FIG. 12 is a pictorial sectional view of the electronic device 20 used for the evaluation.

As shown in FIG. 12, in the evaluation, thicknesses $t_1$, $t_2$ of the first wiring substrate 21 and the second wiring substrate 22 were set to 0.4 mm. Also, an interval $D_1$ between the wiring substrates 21, 22 was set to 0.6 mm to 0.7 mm, and an interval $D_2$ between the lower surface 21a and the upper surface 22b was set to 1.4 mm to 1.5 mm.

A space filled with the air is interposed between the wiring substrates 21, 22, and an entire dielectric constant of the electronic device 20 is an average of respective dielectric constants of the wiring substrates 21, 22 and the space S.

FIG. 13 shows calculated wavelengths of the radio wave in the space S and calculated wavelengths of the radio wave in the wiring substrates 21, 22. In the meantime, the frequency of the radio wave was set to 2.4 GHz. Also, each of the wiring substrates 21, 22 was approximated to a dielectric having a dielectric constant of 4.

As shown in FIG. 13, the 1/16 wavelength is 15.6 mm in the space S and is 7.8 mm in each of the wiring substrates 21, 22. An average wavelength of the wavelengths in the structure of FIG. 12 is about 11 mm to 12 mm. Since the interval $D_2$ (1.4 mm to 1.5 mm) of FIG. 12 is sufficiently small, i.e., about 1/10 of the average wavelength, a stacked structure of each of the wiring substrates 21, 22 can be regarded as a thin insulation plate at frequencies of 2.4 GHz or higher.

Therefore, each of the ground patterns 31 to 34 provided on each of the wiring substrates 21, 22 can also be regarded as a ground pattern of one plate having no substantial unevenness, so that it is possible to suppress the turbulence of the radio wave, which is caused due to unevenness of the conductor.

In the below, a variety of modified embodiments of the first exemplary embodiment are described.

(1) First Modified Embodiment

Figure 14A:
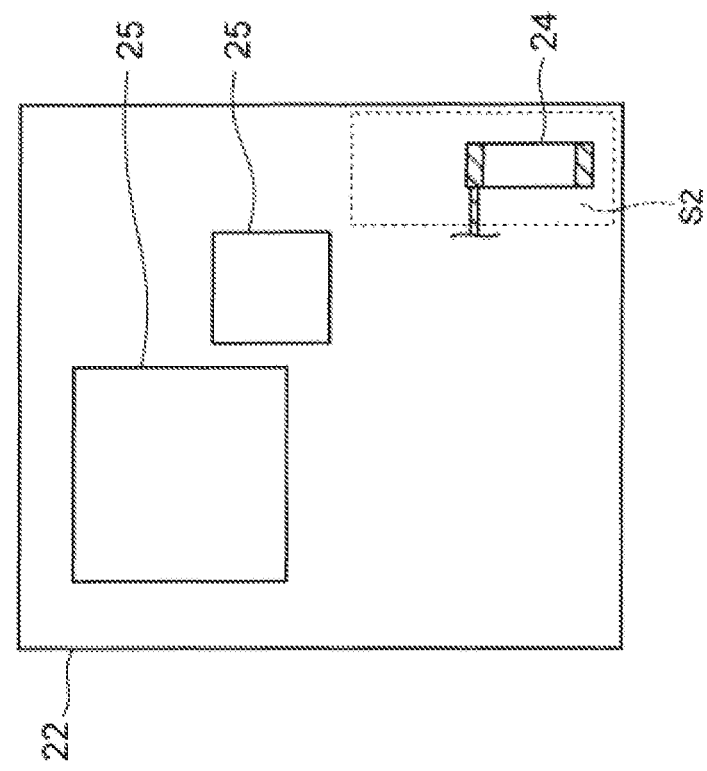
FIG. 14A is a top view of the first wiring substrate in accordance with a first modified embodiment of the first exemplary embodiment.
Figure 14B:
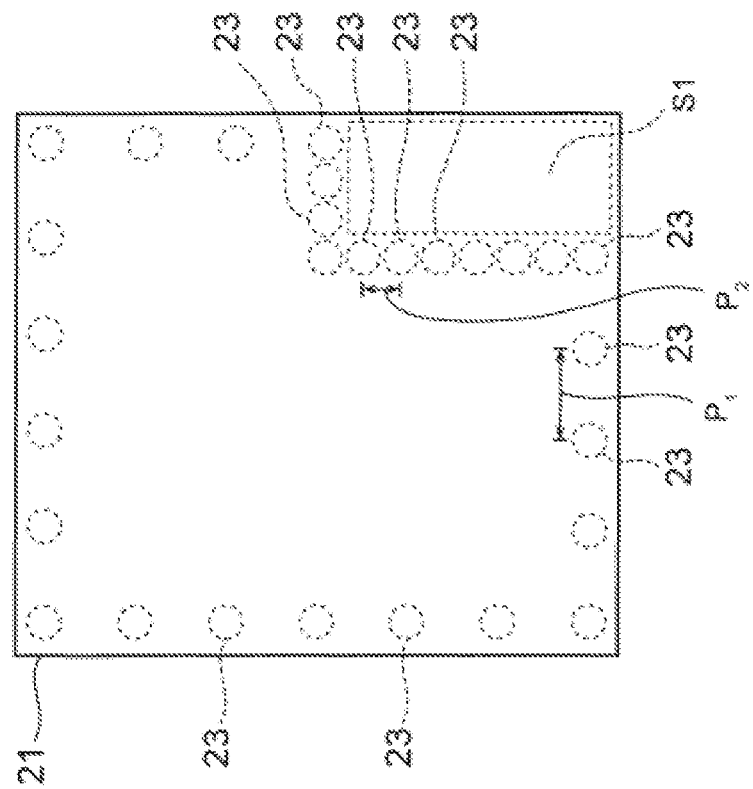
FIG. 14B is a top view of the second wiring substrate in accordance with the first modified embodiment of the first exemplary embodiment.

FIG. 14A is a top view of the first wiring substrate 21 in accordance with a first modified embodiment, and FIG. 14B is a top view of the second wiring substrate 22 in accordance with the first modified embodiment.

Meanwhile, in FIGS. 14A and 14B, the same elements as FIGS. 4 to 13 are denoted with the same reference numerals as FIGS. 4 to 13, and the descriptions thereof are omitted.

As shown in FIG. 14A, in the first modified embodiment, the terminals 23 are aligned with a first interval $P_1$ along the edges of the first wiring substrate 21. Also, the terminals 23 are aligned with a second interval $P_2$ narrower than the first interval $P_1$ along the edges of the first corner part S1.

As shown in FIG. 14B, the chip antenna 24 is provided at the second corner part S2, which is positioned above the first corner part S1, of the four corners of the second wiring substrate 22.

In this way, the terminals 23 are densely aligned along the edges of the first corner part S1, so that an impedance of each of the ground patterns 31 to 34 at the edges of the first corner part S1 is reduced. Thereby, since the potential of each of the ground patterns 31 to 34 at the edges of the first corner part S1 is difficult to vary from the ground potential, potential differences between the chip antenna 24 and the ground patterns clearly appear, so that it is possible to favorably receive the radio wave by the chip antenna 24.

In the meantime, the second interval $P_2$ is not particularly limited. However, it is preferably to set the second interval $P_2$ to a narrow value of 1/50 or smaller of the wavelength of the radio wave to be transmitted and received by the chip antenna 24 so that each terminal 23 can be substantially regarded as one conductor and the ground region is to clearly appear next to the chip antenna 24.

(2) Second Modified Embodiment

As described above with reference to FIGS. 8A to 9B, in the second modified embodiment, the conductor is excluded from the corner parts S1, S2 of the respective wiring substrates 21, 22, so that the characteristic of the chip antenna 24 is maintained. In this case, the more distant the conductor is from the chip antenna 24, the conductor less influences the chip antenna 24. Therefore, the more distant the first to fourth conductor formation regions R1 to R4 are from the chip antenna 24, it is possible to secure the wider regions.

In the second modified embodiment, a degree of design freedom of the electronic device 20 is increased by taking advantage of a degree of freedom of each of the conductor formation regions R1 to R4, as follows.

Figure 15:
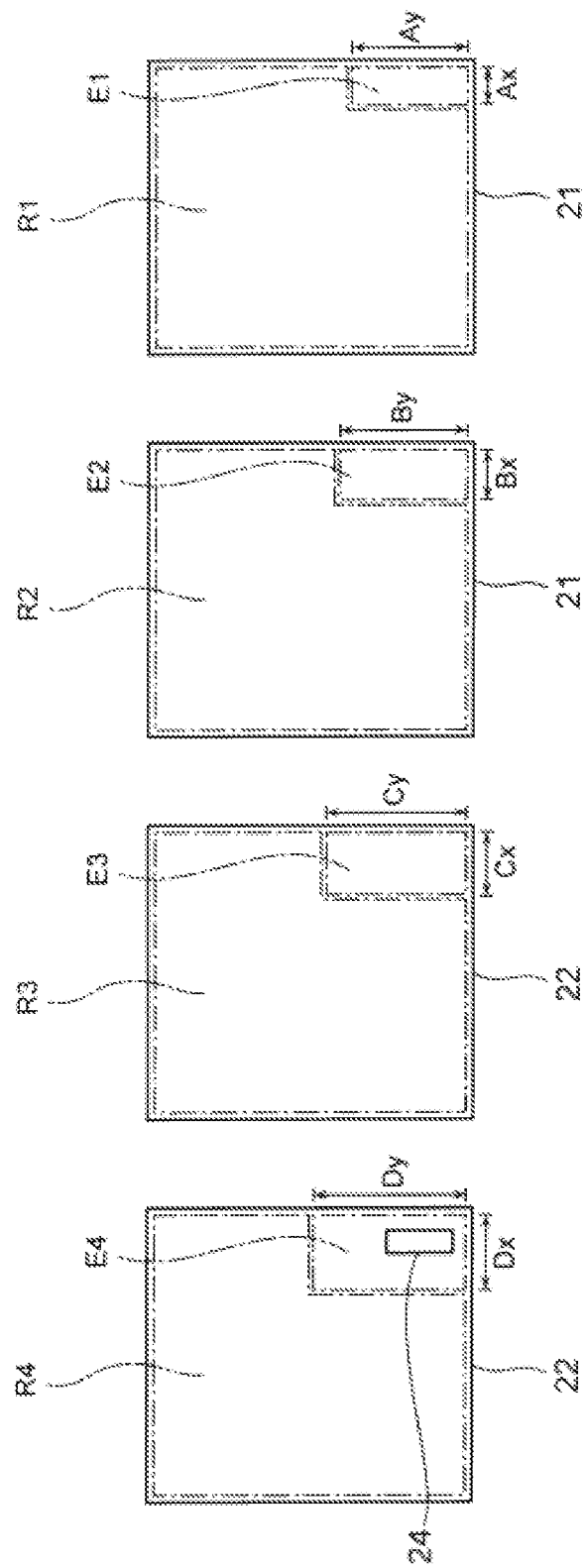
FIG. 15 is a projective plan view of the first wiring substrate and the second wiring substrate in accordance with a second modified embodiment of the first exemplary embodiment.

FIG. 15 is a projective plan view of the first wiring substrate 21 and the second wiring substrate 22 in accordance with the second modified embodiment.

Meanwhile, in FIG. 15, the same elements as FIGS. 4 to 14B are denoted with the same reference numerals FIGS. 4 to 14B, and the descriptions thereof are omitted.

As shown in FIG. 15, in the second modified embodiment, an area of the fourth dielectric region E4 of the uppermost layer is largest, and areas are reduced in order of a third dielectric region E3, a second dielectric region E2 and a first dielectric region E1. In the meantime, the dielectric regions E1 to E4 have a rectangular shape, respectively, and are similar to each other.

Thereby, the areas are relatively larger in order of the fourth conductor formation region R4, the third conductor formation region R3, the second conductor formation region R2 and the first conductor formation region R1. Therefore, there are rooms for arranging the signal lines 31a, 32a, 33a, 34a (refer to FIG. 6) and the ground patterns 31 to 34 in the conductor formation regions R1 to R4, so that the degree of design freedom of the electronic device 20 is increased.

In the meantime, a size of each of the dielectric regions E1 to E4 is not particularly limited.

For example, when a length of a short side of the first dielectric region E1 is denoted as Ax and a length of a long side thereof is denoted as Ay, a length Bx of a short side of the second dielectric region E2 may be set to about Ax+0.5 mm and a length By of a long side thereof may be set to about Ay+0.5 mm.

Also, a length Cx of a short side of the third dielectric region E3 may be set to about Ax+1.0 mm and a length Cy of a long side thereof may be set to about Ay+1.0 mm.

Also, a length Dx of a short side of the fourth dielectric region E4 may be set to about Ax+1.5 mm and a length Dy of a long side thereof may be set to about Ay+1.5 mm.

(3) Third Modified Embodiment

Figure 16:
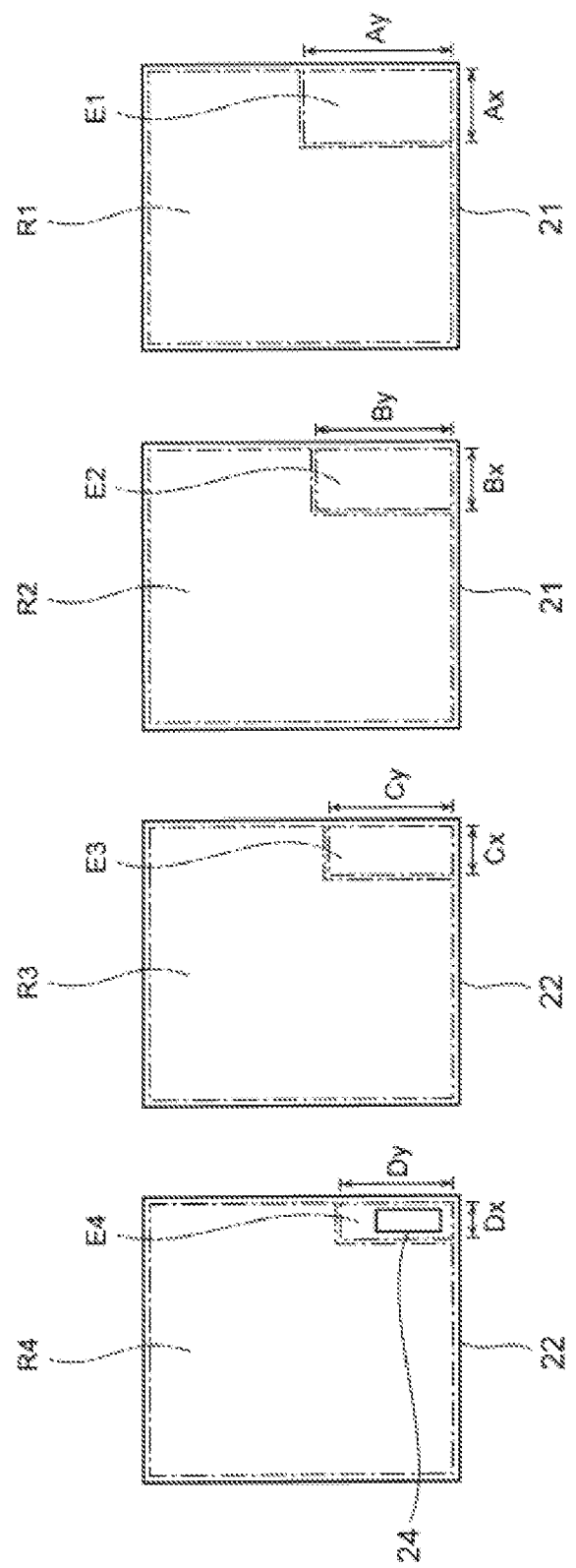
FIG. 16 is a projective plan view of the first wiring substrate and the second wiring substrate in accordance with a third modified embodiment of the first exemplary embodiment.

FIG. 16 is a projective plan view of the first wiring substrate 21 and the second wiring substrate 22 in accordance with a third modified embodiment.

Meanwhile, in FIG. 16, the same elements as FIGS. 4 to 15 are denoted with the same reference numerals as FIGS. 4 to 15, and the descriptions thereof are omitted.

As shown in FIG. 16, in the third modified embodiment, contrary to the second modified embodiment, the area of the fourth dielectric region E4 of the uppermost layer is smallest, and the areas are increased in order of the third dielectric region E3, the second dielectric region E2 and the first dielectric region E1. In the meantime, like the second modified embodiment, the dielectric regions E1 to E4 have a rectangular shape, respectively, and are similar to each other.

Even in this configuration, since the conductor is excluded from each of the dielectric regions E1 to E4, it is possible to maintain the characteristic of the chip antenna 24.

In the meantime, the size of each of the dielectric regions E1 to E4 is not particularly limited.

For example, when the length of the short side of the first dielectric region E1 is denoted as Ax and the length of the long side thereof is denoted as Ay, the length Bx of the short side of the second dielectric region E2 may be set to about Ax−0.5 mm and the length By of a long side thereof may be set to about Ay−0.5 mm.

Also, the length Cx of the short side of the third dielectric region E3 may be set to about Ax−1.0 mm and the length Cy of the long side thereof may be set to about Ay−1.0 mm.

Also, the length Dx of the short side of the fourth dielectric region E4 may be set to about Ax−1.5 mm and the length Dy of the long side thereof may be set to about Ay−1.5 mm.

Second Exemplary Embodiment

In a second exemplary embodiment, an electronic module including the electronic device 20 described in the first exemplary embodiment is described.

Figure 17:
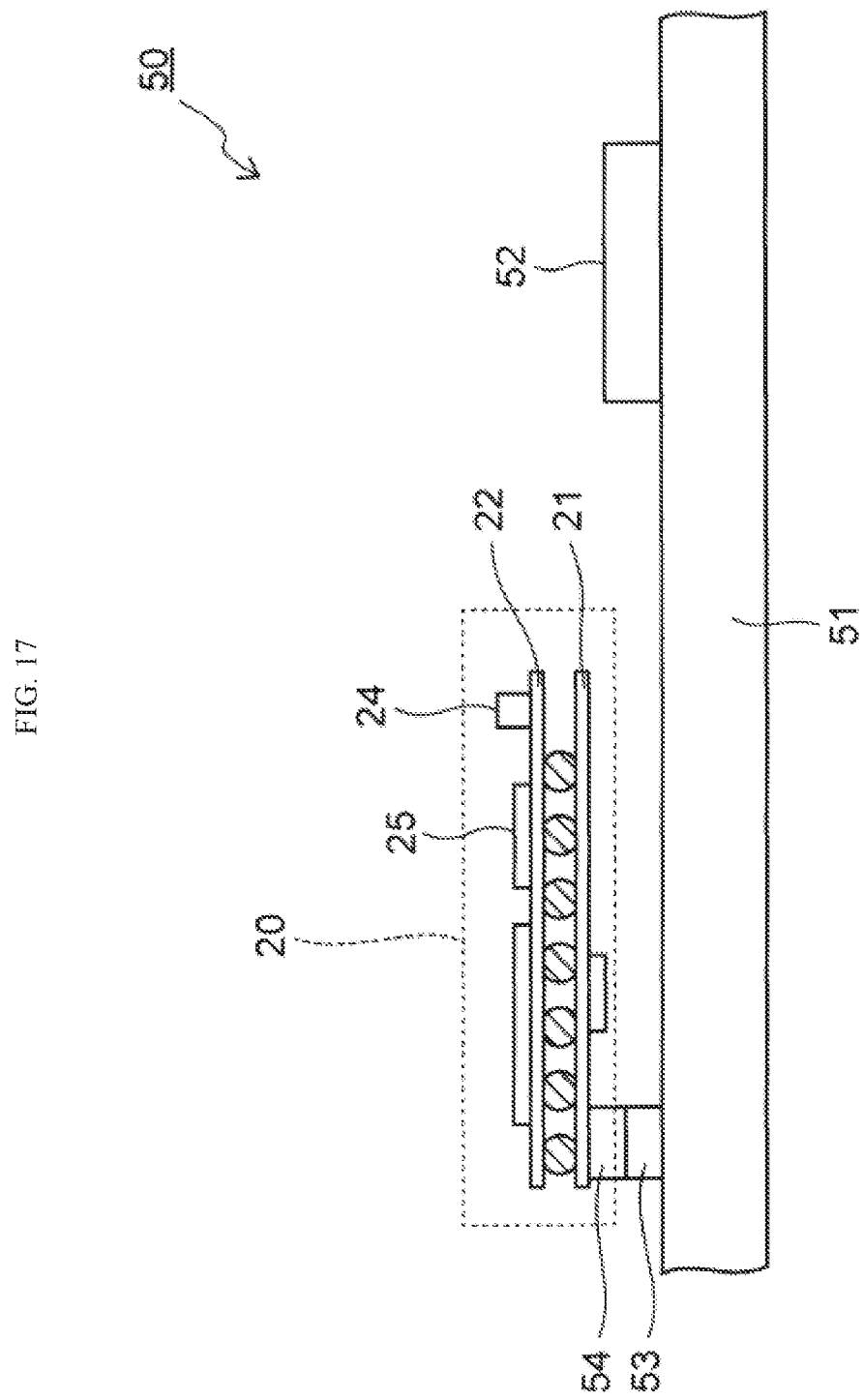
FIG. 17 is a sectional view of an electronic module in accordance with a second exemplary embodiment.

FIG. 17 is a sectional view of an electronic module in accordance with the second exemplary embodiment.

Meanwhile, in FIG. 17, the same elements as the first exemplary embodiment are denoted with the same reference numerals as the first exemplary embodiment, and the descriptions thereof are omitted.

The electronic module 50 is a wearable device configured to acquire biological information such as a heart rate, and includes a circuit substrate 51 on which an electronic component 52 such as a heart rate sensor, a battery and the like is mounted.

A first socket 53 is further fixed to the circuit substrate 51, and a second socket 54, which can be detachably mounted to the first socket 53, is fixed to the electronic device 20. Power is fed from the circuit substrate 51 to the electronic device 20, and the biological information such as a heart rate is wirelessly transmitted from the chip antenna 24 of the electronic device 20 to an outside.

According to the above structure, since the electronic device 20 is detachably mounted to the circuit substrate 51 by the respective sockets 53, 54, it is possible to reuse the electronic device 20 including the high-priced electronic component 25 such as an IC.

Further, as described in the first exemplary embodiment, the chip antenna 24 is provided at the second corner part S2 of the second wiring substrate 22, so that the electronic device 20 is downsized. Accordingly, it is possible to implement the downsizing of the electronic module 50, too.

In the meantime, the structure of the electronic module 50 is not limited to the above-described structure.

Figure 18:
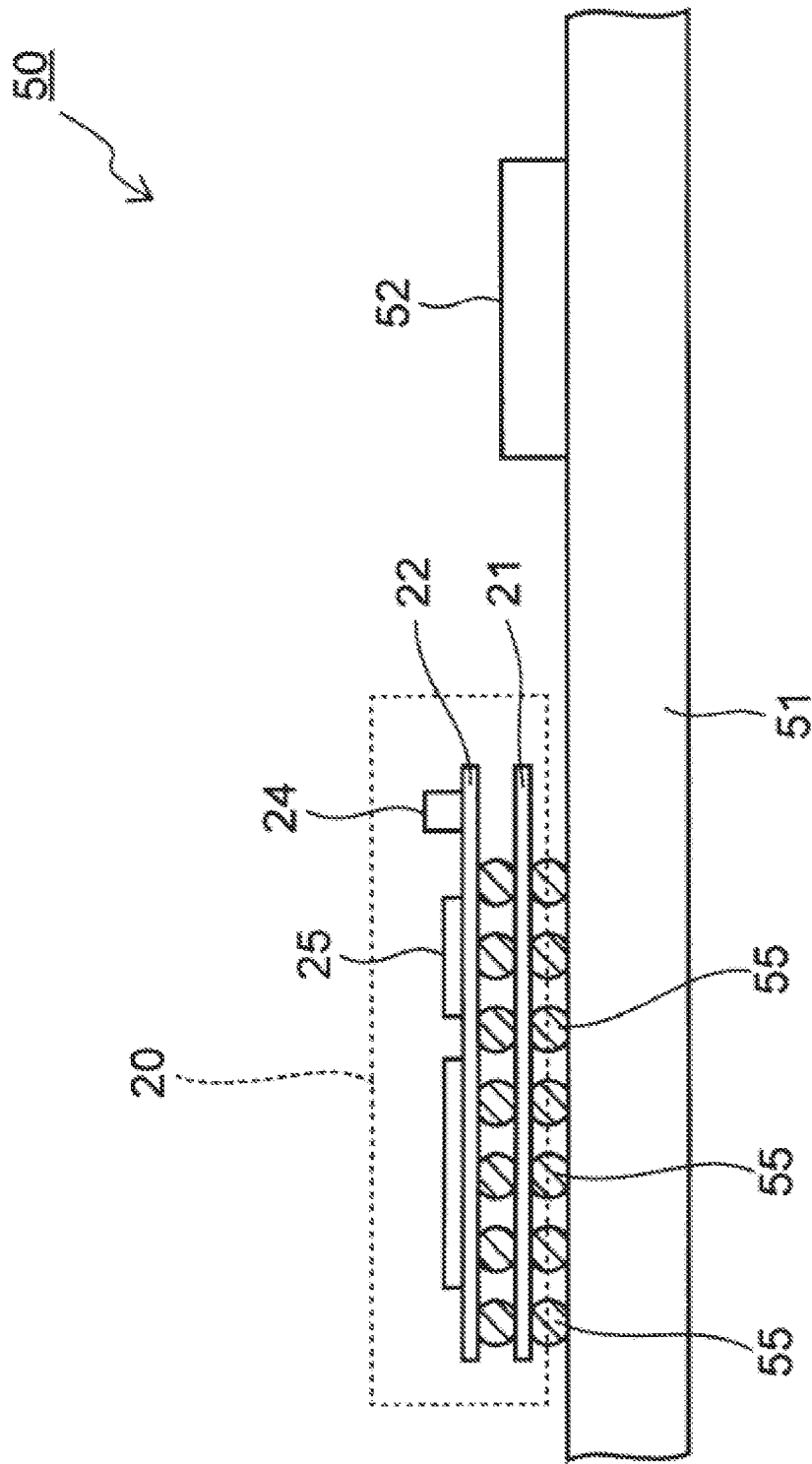
FIG. 18 is a sectional view of an electronic module in accordance with another example of the second exemplary embodiment.

FIG. 18 is a sectional view of the electronic module 50 in accordance with another example of the second exemplary embodiment.

In the example of FIG. 18, a plurality of solder bumps 55 is provided, instead of the respective sockets 53, 54, and the circuit substrate 51 and the electronic device 20 are interconnected by the solder bumps 55. Thereby, it is possible to further downsize the electronic module 50, as compared to the configuration where the sockets 53, 54 are provided.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic device comprising:
a first wiring substrate having a first corner part;
a first ground pattern formed on a lower surface of the first wiring substrate with avoiding the first corner part;
a second ground pattern formed on an upper surface of the first wiring substrate with avoiding the first corner part;
a second wiring substrate provided above the first wiring substrate with facing the first wiring substrate and comprising a second corner part above the first corner part;
a third ground pattern formed on a lower surface of the second wiring substrate with avoiding the second corner part;
a fourth ground pattern formed on an upper surface of the second wiring substrate with avoiding the second corner part;
a plurality of terminals provided between the first wiring substrate and the second wiring substrate and electrically connected to each of the first ground pattern, the second ground pattern, the third ground pattern and the fourth ground pattern; and
an antenna fixed to the upper surface of the second wiring substrate at the second corner part,
wherein the plurality of terminals is respectively aligned with a first interval between adjacent terminals of the plurality of terminals along an edge of the first wiring substrate and is also aligned with a second interval between adjacent terminals of the plurality of terminals along an edge of the first corner part, wherein the second interval is narrower than the first interval.

2. The electronic device according to claim 1, further comprising:
a conductor pattern provided on the second wiring substrate and connected to the antenna,
wherein a conductor does not exist at the first corner part, when projected from above the first wiring substrate, and
wherein a conductor except the conductor pattern does not exist at the second corner part, when projected from above the second wiring substrate.

3. The electronic device according to claim 1, further comprising:
a first region, which is demarcated on the lower surface of the first wiring substrate at the first corner part and in which the first ground pattern is not formed,
a second region, which is demarcated on the upper surface of the first wiring substrate at the first corner part and in which the second ground pattern is not formed,
a third region, which is demarcated on the lower surface of the second wiring substrate at the second corner part and in which the third ground pattern is not formed,
a fourth region, which is demarcated on the upper surface of the second wiring substrate at the second corner part and in which the fourth ground pattern is not formed,
wherein an area of the fourth region is larger than an area of the third region, the area of the third region is larger than an area of the second region, and the area of the second region is larger than an area of the first region.

4. An electronic module comprising:
a circuit substrate; and
the electronic device according to claim 1, provided on the circuit substrate.

5. An electronic device comprising:
a first wiring substrate having a first corner part;
a first ground pattern formed on a lower surface of the first wiring substrate with avoiding the first corner part;
a second ground pattern formed on an upper surface of the first wiring substrate with avoiding the first corner part;
a second wiring substrate provided above the first wiring substrate with facing the first wiring substrate and comprising a second corner part above the first corner part;
a third ground pattern formed on a lower surface of the second wiring substrate with avoiding the second corner part;
a fourth ground pattern formed on an upper surface of the second wiring substrate with avoiding the second corner part;
a plurality of terminals provided between the first wiring substrate and the second wiring substrate and electrically connected to each of the first ground pattern, the second ground pattern, the third ground pattern and the fourth ground pattern; and
an antenna fixed to the upper surface of the second wiring substrate at the second corner part,
wherein the electronic device further comprises:
a first region, which is demarcated on the lower surface of the first wiring substrate at the first corner part and in which the first ground pattern is not formed,
a second region, which is demarcated on the upper surface of the first wiring substrate at the first corner part and in which the second ground pattern is not formed,
a third region, which is demarcated on the lower surface of the second wiring substrate at the second corner part and in which the third ground pattern is not formed, and
a fourth region, which is demarcated on the upper surface of the second wiring substrate at the second corner part and in which the fourth ground pattern is not formed,
wherein an area of the fourth region is larger than an area of the third region, the area of the third region is larger than an area of the second region, and the area of the second region is larger than an area of the first region.

6. An electronic module comprising:
a circuit substrate; and
the electronic device according to claim 5, provided on the circuit substrate.

7. The electronic device according to claim 5, wherein each of the plurality of terminals is provided along an edge of the first corner part.

8. The electronic device according to claim 5, further comprising:
a conductor pattern provided on the second wiring substrate and connected to the antenna,
wherein a conductor does not exist at the first corner part, when projected from above the first wiring substrate, and
wherein a conductor except the conductor pattern does not exist at the second corner part, when projected from above the second wiring substrate.

* * * * *

UNITED STATES PATENT AND TRADEMARK OFFICE
CERTIFICATE OF CORRECTION

PATENT NO. : 10,791,623 B2
APPLICATION NO. : 16/221965
DATED : September 29, 2020
INVENTOR(S) : Tomoharu Fujii Page 1 of 1

It is certified that error appears in the above-identified patent and that said Letters Patent is hereby corrected as shown below:

On the Title Page

Item (73) Assignee:
Change "SHINKO ELECTRONIC INDUSTRIES CO., LTD." to --SHINKO ELECTRIC INDUSTRIES CO., LTD.--.

Signed and Sealed this
Twenty-ninth Day of December, 2020

Andrei Iancu
*Director of the United States Patent and Trademark Office*